United States Patent [19]

Ando

[11] 4,150,441

[45] Apr. 17, 1979

[54] CLOCKED STATIC MEMORY

[75] Inventor: Hisashige Ando, Santa Clara, Calif.

[73] Assignee: Microtechnology Corporation, Sunnyvale, Calif.

[21] Appl. No.: 890,627

[22] Filed: Mar. 20, 1978

[51] Int. Cl.² .............................................. G11C 11/40
[52] U.S. Cl. .................................. 365/189; 365/182; 365/203; 365/207
[58] Field of Search ................ 307/238, 279; 365/154, 365/182, 189, 203, 207, 230, 231

[56] References Cited

U.S. PATENT DOCUMENTS 3,972,031  7/1976  Riemeuschneider ................ 365/189

Primary Examiner—Terrell W. Fears
Attorney, Agent, or Firm—Schatzel & Hamrick

[57] ABSTRACT

A clocked static memory comprising a memory matrix, sense driver and a logic circuit connected between a pair of data lines in the memory matrix. The memory matrix includes a plurality of static memory cells arranged in rows and columns and are of the type adapted to provide a voltage differential at the bit lines whenever that particular memory cell is selected. A logic circuit detects the actual data output on the bit lines and is buffered by an amplifier to provide a memory status output signal indicating the existence of valid data output.

8 Claims, 2 Drawing Figures

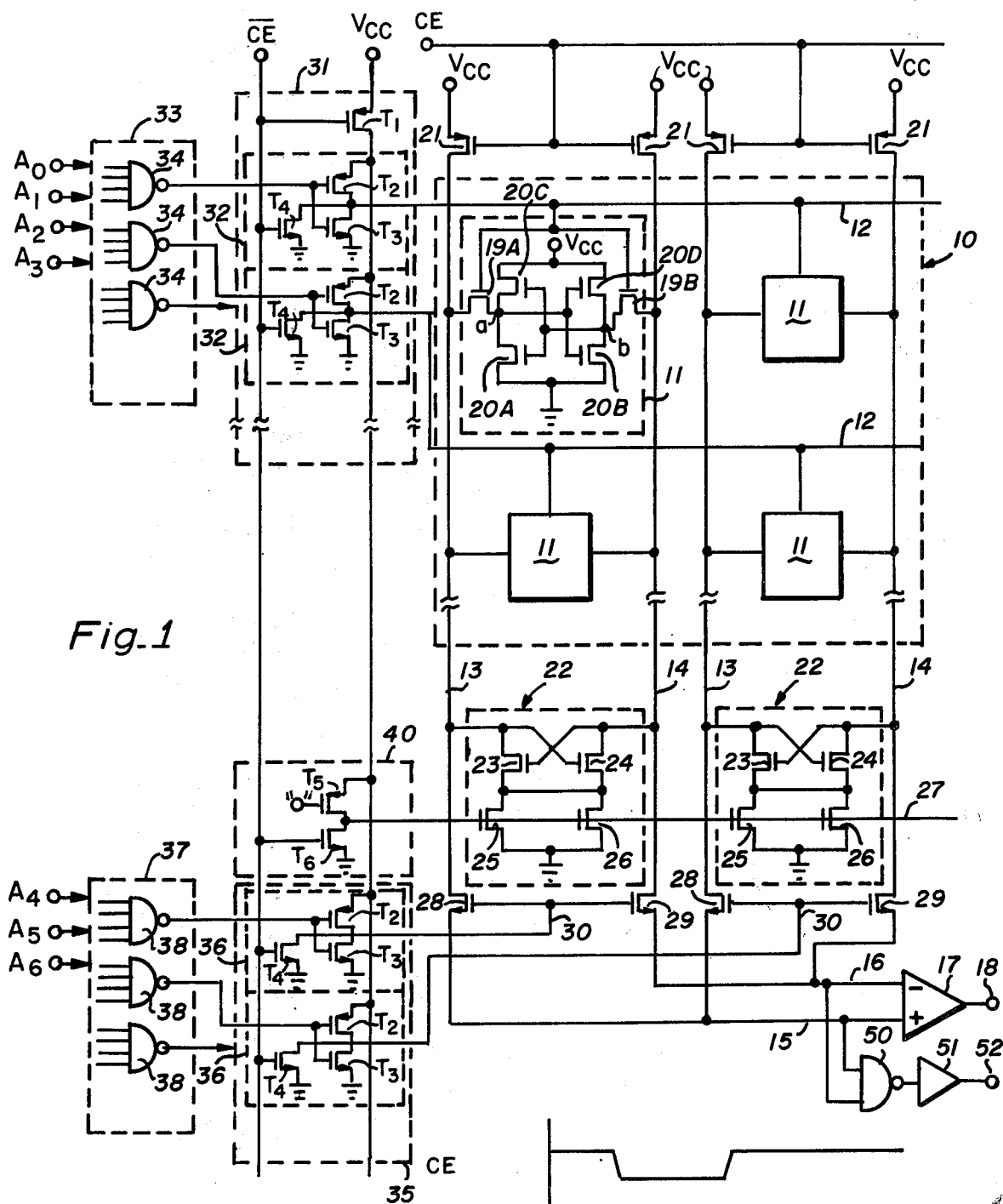
Fig._1
Fig._2

CLOCKED STATIC MEMORY

BACKGROUND OF THE INVENTION

1. Field of the Invention

This invention relates to the clocked static memory and more specifically to a clocked static memory with logic circuit for creating a memory status signal to indicate the availability of valid data output.

2. Description of the Prior Art

Conventional static memories have been produced on semiconductor substrates by using semiconductor technology, especially MOS (metal oxide semiconductor) technology. A plurality of memory cells are arranged on the substrate in a matrix with each of the memory cells connected to a word select line and a pair of bit lines. Each memory cell generally comprises a latch of flip-flop circuit formed by MOS transistors.

The word select lines are connected to and selected by a row address decoder network whereas each pair of bit lines is selected responsive to a column address decoder.

Various static memories include a latch or dynamic presense amplifier connected between the pair of bit lines to detect a signal from the selected memory cell in the column. The bit line signal is transferred to data lines through control gates and finally amplified in a sense amplifier commonly connected to the data lines.

Recently, a MOS static memory was introduced in which a reference row was created with the resistance and capacitive loading equal to that of the row or word select lines. The reference row is a part of the memory matrix and comprised of a reference line loaded with a pair of transistors in each column which represent the cell loading. A buffer amplifier is connected to the end of the reference line. A reference row driver is clocked by the same clock signal as the decoder and the output of the reference row driver is supplied to the reference line.

The buffered output is also connected to a delay element thereby providing a properly delayed memory status output signal. For that purpose, it is required that there be a proper choice and design of delay element. The memory status output signal is used as a clock signal to the following circuits instead of the conventional clock signal thereby enabling faster acquisition of accessed data and improving the system performance. Because of parameter variations of the elements which are commonly encountered in actual fabrications of MOS memories, difficulties are encountered in realizing properly timed memory status output signals. Such a circuit is illustrated and described in an article of the *IEEE Journal of Solid-State Circuits*, Volume SC-11, No. 5, October 1976, entitled "Two 4K Static RAM's."

SUMMARY OF THE PRESENT INVENTION

It is a principal object of the present invention to provide a clocked static memory with simplified memory status signal circuitry.

It is another object of present invention to provide a clocked static memory capable of generating a memory status signal accurately tracking an actual data output timing even under large parameter variations of the memory elements.

Briefly, the clocked static memory of the present invention includes a logic circuit connected between a pair of data lines which are connected to the memory matrix through control gates. The memory matrix includes a plurality of static memory cells arranged in rows and columns. The memory cells are of the typed adapted to provide voltage differential at the bit lines whenever that particular memory cell is selected. The bit lines are connected in series with control gates which are in turn connected to data lines. A logic circuit detects the actual data output on the data lines and is buffered by an amplifier to provide a memory status output signal.

An advantage of the present invention is that it provides a simplified clocked static memory with memory status output signal capabilities.

Another advantage of the present invention is that it provides a clocked static memory with memory status otuput signal capabilities and in which the status may be rapidly detected.

A further advantage of the present invention is that it provides a clocked static memory which generates a memory status output signal which indicates the existence of valid data output so that the following circuitry can be operated at improved speed by using the memory status output signal as the clock signal in the following circuitry.

These and other objects and advantages of the present invention will no doubt become apparent after having read the following detailed description of the preferred embodiment which is illustrated in the figures of the drawing.

IN THE DRAWING

FIG. 1 is a circuit diagram of a clocked static memory in accordance with the present invention; and FIG. 2 is a time chart and waveforms of several input and output signals in the memory of FIG. 1.

DETAILED DESCRIPTION OF THE PREFERRED EMBODIMENT

The circuit diagram of FIG. 1 includes a memory matrix referred to by the general reference character 10. The matrix 10 is comprised of a plurality of memory cells 11 arranged in rows and columns. Each memory cell 11 is connected to a horizontal word select line 12 and a pair of vertical bit lines 13 and 14. Each pair of bit lines 13 and 14 is connected to a pair of data lines 15 and 16, through control gates as hereafter described. The data lines 15 and 16 are in turn connected to a sense amplifier 17 which is primarily comprised of a differential amplifier having an output terminal 18.

The memory cells 11 may be comprised of any various conventional cells. For example, in view of the low power consumption, complementary metal oxide semiconductor (CMOS) transistors may be used to make up the cell. As diagrammatically illustrated in FIG. 1, the cell 11 may be comprised of two N-channel logic steering transistors 19A and 19B connected to the corresponding bit lines 13 and 14, and the associated word select line 12, two N-channel transistors 20A and 20B tied to ground, and two P-channel transistors 20C and 20D tied to the potential $V_{cc}$. The transistors 20A, 20B, 20C and 20D form a latch or flip-flop for sustaining a memory condition.

The bit lines 13 and 14 joined to a common column of cells 11 are each connected to a pre-charge transistor 21 which is joined to the voltage source $V_{cc}$. The gates of transistors 21 associated with a common column of cells are also tied to each other. The precharge transistor 21 may be formed by a P-channel MOS transistor.

Each column of memory cells 11 is connected to a presense amplifier 22. The presense amplifiers 22 each include a pair of cross-coupled N-channel transistors 23 and 24 and a pair of transistors 25 and 26. The pair of transistors 25 and 26 corresponds to the logic steering transistor 19A and 19B of the cells 11 in terms of capacitive loading. A single sense clock line 27 crosses over the pair of transistors 25 and 26 each column.

In each column of memory cells 11, a pair of control gates in the form of transistors 28 and 29 is connected to the bit lines 13 and 14, respectively, to control connection of the bit lines 13 and 14 to the data lines 15 and 16. The gates of the transistors 28 and 29 are tied in common to a column select line 30 to provide a column select means for selecting columns of the memory matrix 10.

A row drive circuit 31 is provided and connected to the word select line 12. As illustrated, the word drive circuit 31 is comprised of a plurality of CMOS drivers 32, each of which is connected to a word select line 12. The CMOS drivers 32 are each comprised of a P-channel transistor $T_2$ and a pair of N-channel transistors $T_3$ and $T_4$. A transistor $T_1$ is common to all the drivers. The transistors $T_1$, $T_2$, $T_3$ and $T_4$ in combination form a NOR gate. The P-channel transistor $T_1$ is connected to the voltage source $V_{cc}$ and its gate is connected to an inverted chip enable signal $\overline{CE}$.

A row decoder 33, primarily comprised of NAND gates 34, provides control signals to the row drive circuit 31. The NAND gates 34 receive and respond to a set of address signals, illustrated in this example as $A_0$, $A_1$, $A_2$ and $A_3$. The gates of the transistor pair $T_2$ and $T_3$ of each element 32 are connected to the output terminals of the NAND gates 34.

A column driver circuit 35, comprising a plurality of CMOS drivers 36 similar to the CMOS drivers 32, is provided. The column drive circuit 35 is adapted to drive any one of the column select lines. 30.

A column decoder 37, including a plurality of NAND gates 38, provides control signals to the column drive circuit 35. The NAND gates 38 receive and respond to a set of address signals, illustrated in this example as $A_4$, $A_5$ and $A_6$. The NAND gates 38 output the decoded control signal to the column drive circuit 35.

A sense drive circuit 40 is provided and clocked by the same clock enable signal $\overline{CE}$ as the row and column drive circuits 31 and 35. The sense drive circuit 40 provides a delayed sense clock signal synchronized with the word select signals in each column. The sense drive circuit 40 includes a P-channel transistor $T_5$ and an N-channel transistor $T_6$. The transistor $T_5$ is supplied a logic "0" signal at its gate while the N-channel transistor $T_6$ is controlled by the $\overline{CE}$ signal. The transistor $T_5$ is provided with controlled driving capability. In the embodiment, the P-channel transistor $T_5$ is designed so as to provide a limited drive current. For this purpose the transistor $T_5$ is of decreased size. In a special layout design on a substrate, the channel length of the transistor $T_5$ may be fixed so that the channel width is a variable parameter. The transistor $T_5$ is designed to provide the proper delay and generally it has been found adequate to decrease the channel width of the transistor $T_5$ to one-half of the channel width of the driving transistor $T_2$ of the drivers 32.

It should be noted that the word select lines 12 are parallel to the sence clock line 27 and have the same length from the corresponding drive circuits (31, 40) to the selected memory cell 11 thereby equalizing the series resistance. It should be further noted that the sense clock line 27 and word select lines 12 have equal capacitive loading. It is known to use polycrystalline silicon as the lines 12 and 27. Polycrystalline silicon has relatively high resistivity, thereby delaying the signal to be traveled.

The operation of the circuitry of FIG. 1 is believed to be as follows:

The precharge transistors 21 are conductive when the chip enable signal CE is at logic signal "0" level thereby equalizing the voltage level of the bit lines 13 and 14 to the $V_{cc}$ level. The address signals $A_0$ to $A_6$ are delivered to the decoders 33 and 37. The CE signal is set to logical "1" shortly after the address signals go through the decoders 33 and 37. The row driver circuit 31 generates the row select signal on the word select line 12. Simultaneously, the column drive circuit 35 generates a column select signal on the column select line 30 under the control of the decoder 37. In a particular example, assume that the select lines 12 and 30 are selected so as to select the memory cell 11 located in the upper left-hand corner of the matrix and that it is stored in the logical "1" state. In this condition transistor 20A is in the "off" state, transistor 20B is in the conductive state, transistor 20C is in the conductive state, and transistor 20D is in the "off" state. As a result the junction point "a" of transistors 20A and 20C is at the $V_{cc}$ level and the junction point "b" of transistors 20B and 20D is at ground level. The word select signal on line 12 cause transistors 19A and 19B to conduct. Then the $V_{cc}$ level sustained by the cell's own capacitance, decreases on the bit line 14 because of the path formed by transistors 19B and 20B to ground and the voltage on bit line 13 is sustained because of the path formed by the transistors 19A and 20C to $V_{cc}$. The voltage difference between the lines 13 and 14 is amplified or voltage change on the bit line 14 is promoted by the presense amplifier 22 associated with that column. The sense clock signal on the line 27 is synchronized with the select signal on the associated lines 12 and 30 but still delayed in the amount of $\Delta t_d$ according to the controlled driving capability of transistor $T_5$ of the sense drive circuit 40.

Basically, the delay time $t_d$ of the sense clock signal may be represented as follows:

$$t_d = K + \alpha_0 C_L + \beta R \cdot C_L, \tag{1}$$

where K, $\alpha_O$ and $\beta$ are constants and $C_L$ is a line capacitance including gate capacitances of transistors 25 and 26 of the presense amplifiers 22.

The constant K is primarily concerned with the ratio of stray capacitance and current gain of the driver transistor $T_5$, hence, relatively constant when the channel length is fixed.

The $\alpha_O$ is primarily concerned with the current gain of the transistor $T_5$ which is further related to the channel width of transistor $T_5$ as heretofore described. The constant $\beta$ is unrelated to the transistor size. If the transistor $T_5$ is changed to the transistor $T_2$ of the word drive circuit 32, the delay time $t_{dl}$ is represented as $$t_{dl} = K + \alpha_1 C_L + \alpha R \cdot C_L, \tag{2}$$

where $\alpha_1$ is constant and related to the current gain of $T_2$. The more the current gain of $T_2$ increases, the more the value of the constant $\alpha_1$ decreases. Therefore, the delay $\Delta t_d$ of the sense clock signal relative to the word select signal is expressed as follows:

$$\Delta t_d = t_d - t_{d1}, \text{ or} \quad (3)$$

$$\Delta t_d = (\alpha_0 - \alpha_1)C_L, \quad (4)$$

The delayed sense clock signal on the sense line 27 allows the presence amplifier 22 to cut off the transistor 23 and the transistor 24 to conduct in this particular example. As heretofore explained in connection with the illustrated example, the voltage level on bit line 14 is decreasing and that on bit line 13 remains substantially constant. The sense clock signal then gradually causes the transistors 25 and 26 to conduct. Transistor 24 conducts and transistor 23 remains cut off because of the potentials in bit lines 14 and 13, respectively. With the transistor 24 conducting, it further assists in decreasing the voltage level on bit line 14.

FIG. 2 illustrates a relative time chart of the MEMORY STATUS signals at the terminals 52; DATA LINE signals on the data lines 15 and 16; the SENSE CLOCK signal on the sense line 17; the ROW SELECT signal on the word select line 12; the address signals $A_0$ to $A_3$ and $A_6$ to $A_2$, and the CE clock signal. FIG. 2 further illustrates that the ROW SELECT signal on the word select line 12 may be delayed (illustrated by the dotted line) at cells further removed from the most left-hand side cells 11 of the matrix 10. It follows that the SENSE CLOCK signal on the line 27 is synchronized with the delayed ROW SELECT signal because of the configuration of the parallel word select lines 12 and the sense clock line 27. Furthermore, the delayed SENSE CLOCK signal is provided with the controlled waveform by the transistor $T_5$.

At the same time column select signals are generated so that the transistor 28 and 29 in the select bit lines 13 and 14 conduct. FIG. 2 illustrates by the broken line that the DATA LINE signal is delayed dependent upon the delay in the ROW SELECT and SENSE CLOCK signals.

The sense amplifier 17 outputs the logical "1" at the terminal 18 in the polarity of the amplified signal.

As further shown by FIG. 2, either one of the DATA LINES 15 and 16 changes the voltage level from the almost $+V_{cc}$ level to the pre-amplified lower level regardless of the stored condition of the selected memory cell 11. In illustrated theory of operation of the present embodiment, the voltage level on the DATA LINE 16 is changed while the level on DATA LINE 15 is maintained. When the voltage level of either of the DATA LINES 15 or 16 becomes less than the threshold voltage of the NAND gate 50, the NAND circuit 50 outputs the logical "1" or the high level to a buffer amplifier 51 which is connected to the NAND gate 50. Thus the MEMORY STATUS signal is provided at the output terminal 52 by buffering the logical "1" signal from the NAND circuit 50.

It can be seen from FIG. 2 that the data output signal is delayed from the ROW SELECT signal. However, the MEMORY STATUS signal still follows the delay, since the delays in the signal on the DATA LINES 15 and 16 are automatically included in the input signal to the NAND gate 50. Thus, the rising edge of the MEMORY STATUS signal at the terminal 52 well tracks the data output. These delays vary and the degree of delay variations are primarily caused by parameter variations of the elements the memories. However, in the present invention, these delay variations have no effect on varying the timing relationship of the MEMORY STATUS signal and DATA LINE signals since they are both subjected to the same elements. Thus, even under large parameter variations of the elements of the memory, the MEMORY STATUS signal tracks the DATA LINE signals. This is important in a case where the MEMORY STATUS signal is used as a clock signal in the following circuitry instead of a conventional fixed timing clock signal.

The herein-described embodiment relates to a memory wherein the bit lines 13 and 14 are precharged with the $V_{cc}$ level or logical "1" level. It is also feasible to precharge the bit lines 13 and 14 with a ground reference level. In a case where the bit lines 13 and 14 are precharged with a ground level or logical "0" level, the $V_{cc}$ in FIG. 1 is changed to ground and the transistor pair 21 is changed to N-type MOS transistor pair for avoiding the voltage shift according to the threshold voltage of the P-type MOS transistor. Also, the NAND gate 50 is changed to an OR gate or a combination of a NOR gate and an inverter.

Various alterations and modification of the embodiment described will no doubt become apparent to those skilled in the art after having read the above disclosure. It is therefore intended that the following claims be interpreted to cover all such alterations and modifications as fall within the true spirit and scope of the invention.

What is claimed is

1. A clocked static memory comprising:
    a memory matrix including a plurality of static memory cells arranged in rows and columns, said static memory cells being of a type providing a voltage differential when selected;
    a plurality of word select lines in said memory matrix with said memory cells with each of said word select lines connected to the memory cells in a common row;
    a plurality of bit lines divided into pairs with a column of cells intermediate each pair of bit lines and each memory cell in each of said columns connected between said associated pair of bit lines to provide said voltage differential
    a pair of data lines extending to each pair of bit lines;
    a logic circuit connected between each pair of data lines; and
    a buffer amplifier connected to said logic circuit to output a memory status signal.

2. The clocked static memory of claim 1 further comprising:
    a plurality of presence amplifiers with a presense amplifier connected between each of said pair of bit lines in each column,
    a sense clock line parallel to said word select lines, said sense clock line being connected to said presense amplifiers.

3. The clocked static memory of claim 2 further comprising
    a pair of data lines parallel to said word select lines, said data lines being connected to said pair of bit lines through control gates.

4. The clocked static memory of claim 2 wherein said logic circuit is comprised of a NAND circuit; and further comprising
    a pair of precharging devices in each bit line; and
    a voltage source for precharging said bit lines with a logical "1" level.

5. The clocked static memory of claim 2 wherein said logic circuit comprises of logic OR circuit; and further comprising
- a pair of precharging devices in each bit line; and
- a voltage source for precharging said bit lines with a logical "0" level.

6. The clocked static memory of claim 2 wherein said logic circuit is comprised of a NOR circuit and an inverter gate, and further comprising
- a pair of precharging devices in each bit line; and
- a voltage source for precharging said bit lines with a logical "0" level.

7. A clocked static memory comprising:
- a memory matrix including a plurality of static memory cells arranged in rows and columns, each memory cell having a first pair of logic steering transistors;
- a plurality of word select lines in said memory matrix loading with said logic steering transistors in said memory cell;
- a plurality of bit lines in said memory matrix, said bit lines being divided into pairs with a column of cells intermediate each pair of bit lines and crossing said word select lines, each memory cell in each of said columns connected between said associated pair of bit lines;
- a plurality of presense amplifiers, each of said presense amplifiers being connected between a pair of said bit lines in each column, each of said presense amplifiers comprising a second pair of logic steering transistors;
- a single sense clock line parallel to said word select line, said sense clock line being connected to each of said second pairs of transistors of said presense amplifiers in each column;
- a sense drive circuit connected to said sense clock line, said sense drive circuit including a transistor with decreased driving capability for providing a delayed clock signal output on said sense clock line;
- a row drive circuit connected to said plurality of word select lines and column drive circuit connected to control gates connected to said plurality of bit lines, said row and column drive circuits being comprised of a transistor with higher driving capability than that of said transistor in said presense drive circuit;
- a logic circuit connected between said pair of bit lines; and
- an amplifier connected to said logic circuit to output a memory status signal.

8. The clocked static memory of claim 7 further comprising
- a pair of data lines parallel to said word select lines, said data lines being connected to said pair of bit lines and said logic circuit being connected to said data lines.

* * * * *